United States Patent [19]

Liu

[11] 4,010,483
[45] Mar. 1, 1977

[54] CURRENT CONFINING LIGHT EMITTING DIODE

[75] Inventor: Yet-Zen Liu, Fort Wayne, Ind.

[73] Assignee: International Telephone and Telegraph Corporation, Nutley, N.J.

[22] Filed: Aug. 8, 1974

[21] Appl. No.: 495,488

[52] U.S. Cl. .................................. 357/17; 357/18; 357/58
[51] Int. Cl.² ........................................ H01L 33/00
[58] Field of Search ................... 357/17, 18, 30, 58

[56] References Cited

UNITED STATES PATENTS

| | | | |
|---|---|---|---|
| 3,312,881 | 4/1967 | Yu | 317/235 |
| 3,824,133 | 7/1974 | Dasaro | 148/1.5 |

OTHER PUBLICATIONS

Schade et al., Appl, Phys. Lett., vol. 20, No. 10, May 15 1972, pp. 385–387.

*Primary Examiner*—Martin H. Edlow
*Attorney, Agent, or Firm*—John T. O'Halloran; Richard A. Menelly

[57] ABSTRACT

The resistivity of particular layers of a gallium arsenide-gallium aluminum arsenide light emitting diode is altered to provide current confinement in the central regions around the well hole. This is accomplished by proton bombardment to increase resistivity of layers around the lower metal contact area while leaving a low resistivity path over the contact, by diffusion of a low resistivity region into an added high resistivity layer adjacent the light emitting well hole, or by diffusion into a reverse conductivity barrier layer over the lower metal contact area.

7 Claims, 4 Drawing Figures

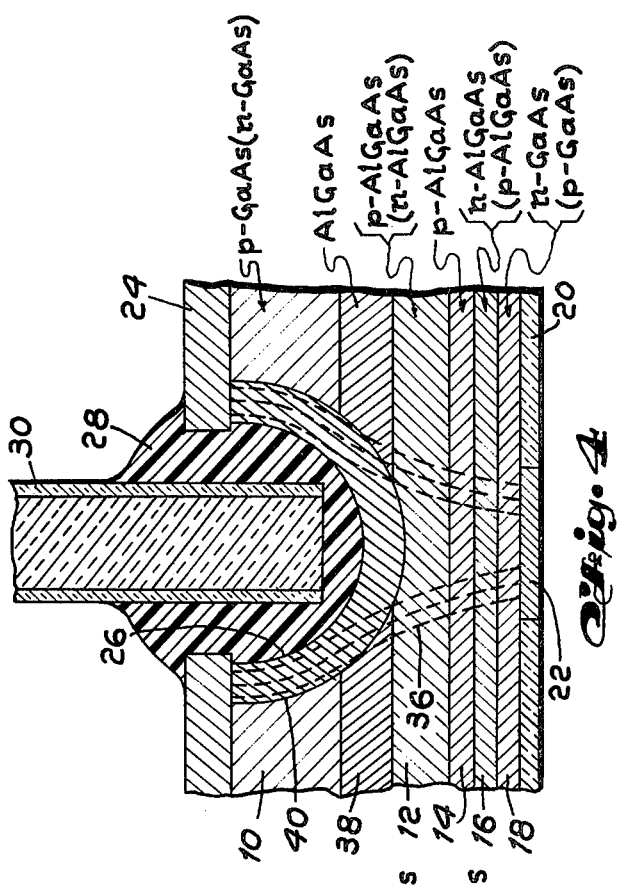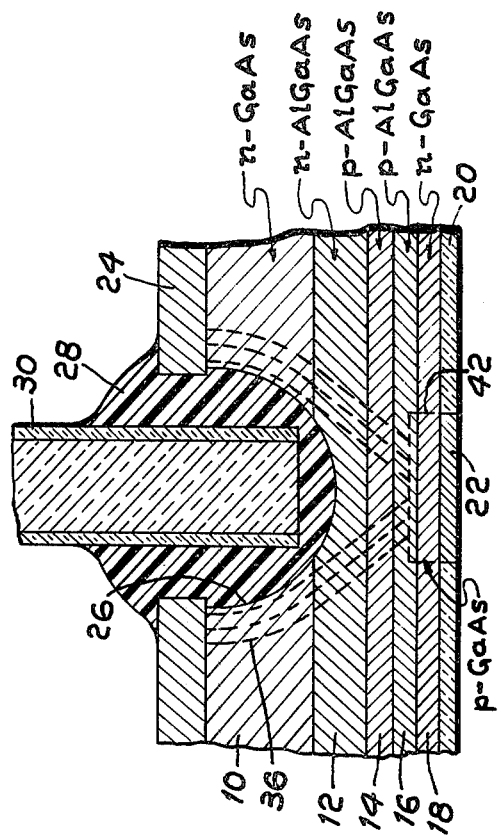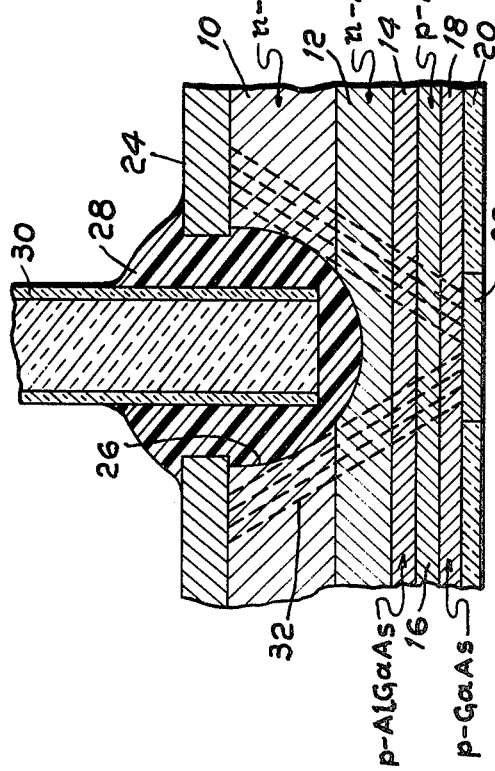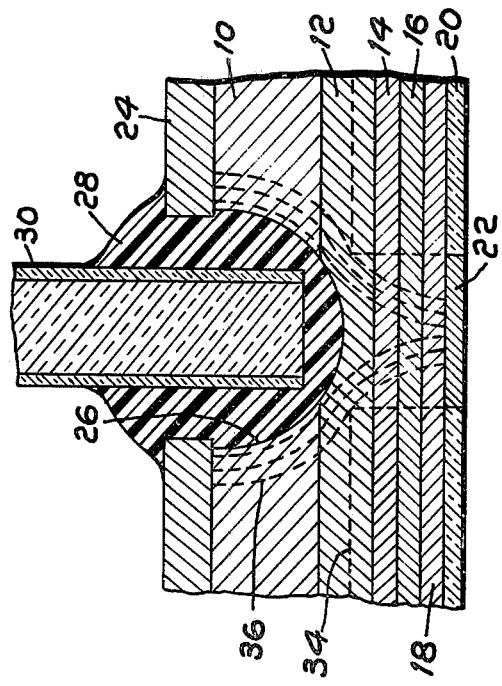

CURRENT CONFINING LIGHT EMITTING DIODE

BACKGROUND OF THE INVENTION

1. Field of the Invention

The present invention concerns a semiconductor light emitting diode with improved current confinement.

2. Description of the Prior Art

Conventional light emitting diodes of a gallium arsenide-gallium aluminum arsenide double heterostructure type are described in an article by C. A. Burrus in Proceedings of the IEEE, February 1972, pages 231–232. Such diodes generally utilize a small area circular geometry contact electrode on the lower surface to help confine current close to a central light emitting well hole area in the upper substrate layer. Current between a large metal contact layer on the upper surface around the well hole and the small lower central contact is usually evenly distributed along straight converging paths and provides light output and optical coupling which are of less than optimum efficiency. In another known laser diode device, as described in articles by R. L. Hartman et al, in Applied Physics Letters, August 1973, pages 181–183, and by J. C. Dyment et al. in Proceedings of the IEEE, June 1972, pages 726–728, a process of proton bombardment has been used to increase the resistivity of GaAs layers to obtain a desired stripe geometry.

SUMMARY OF THE INVENTION

It is therefore the primary object of the present invention to provide an improved structure and method for confining current in light emitting GaAs – AlGaAs diodes.

This is achieved by changing the resistivity of the semiconductor layers in selected areas. In one embodiment, proton bombardment of lower layers to a predetermined depth around the lower contact area increases the resistivity except in the area directly over the contact. This provides a barrier which directs current in a curved path close to the well hole. In another embodiment, a high resistivity undoped AlGaAs layer is provided adjacent the substrate layer and a limited diffusion of dopant is made in the substrate and high resistivity layer around the well hole to form a lower resistivity region which causes current confinement close to the well hole. A further embodiment provides an opposite conductivity reverse bias layer on the lower surface which provides a conduction barrier. A small low resistivity doped zone is then diffused into the layer in the lower contact area which again causes current confinement and provides more efficient light emission and optical coupling in the central area.

Other objects and advantages will become apparent from the following description in conjunction with the accompanying drawings.

BRIEF DESCRIPTION OF THE DRAWINGS

FIG. 1 shows a partial cross-section of the prior art current confining light emitting diode structure, FIG. 2 shows a section of one form of the present novel current confining arrangement using proton bombardment, FIG. 3 shows another form of the improved current confining structure using a diffused region of low resistivity, and FIG. 4 shows a further variation using a diffused region to confine current.

DESCRIPTION OF THE PREFERRED EMBODIMENTS

As shown in FIG. 1, a known type of light emitting semiconductor double heterostructure diode includes a first n-conductivity type GaAs substrate layer 10, on which are formed four successive layers using known liquid phase epitaxial deposition methods. These are an n-type AlGaAs layer 12, a p-type AlGaAs layer 14 of low Al content, another p-type AlGaAs layer 16, and p-type GaAs layer 18. A silicon oxide layer 20 with a hole formed therein for a metal contact layer 22 is provided over layer 18. Another metal contact layer 24 is formed on the other side of substrate layer 10 and a hole etched in the upper metal layer and in layer 10 to form a light emitting well hole 26. An epoxy resin filling 28 and optical fiber 30 are positioned in the hole 26 to couple out the light. The normal current conduction between wide metal layer 24 around hole 26 and narrow contact 22 is confined approximately within straight converging paths of the wide angle indicated at 32.

In order to provide a narrower current confinement region close to the curved boundaries of hole 26, as shown in FIG. 2, a known proton bombardment method is used with the same layered structure of FIG. 1. The proton bombardment converts the material in area 34, shown within dashed lines, including the lower three layers 14, 16, 18 and part of layer 12, around contact 22, to a high resistivity semiconductor material having a sufficient electrical resistance to act as a barrier which confines current flow. The depth of penetration of the proton bombardment may be about 3 microns. The region over contact 22, however, is masked during bombardment and remains of normal lower resistivity. The high resistivity material in area 34 thus causes current conduction to be confined in the central area over contact 22 and around the light emitting hole 26 along the curved paths 36 which improves efficiency and coupling into the optical fiber 30. The structure also prevents undesired current spread at high current levels.

As shown in FIG. 3, current confinement is also achieved by the addition during the deposition process of an undoped high resistivity AlGaAs layer 38 of about 2 to 5 microns in thickness over substrate layer 10 of normal low resistivity. After the hole 26 is formed in layer 10, a p-type dopant is diffused into the substrate area around the hole and penetrates through high resistivity layer 38 into p-type AlGaAs layer 12 which is a normal conductive layer. The diffused dopant provides a low resistivity conductive channel 40 around hole 26 through high resistivity layer 38 and thus provides a curved current confining path close to hole 26 between metal electrode layers 24 and 22. Typical p-type dopants are zinc, cadmium, magnesium and manganese, with zinc being the most commonly used for diffusion.

A similar structure of opposite conductivity types may also be used as indicated in FIG. 3 by the materials in parentheses. Layer 38 of undoped high resistivity AlGaAs would remain the same as would layer 14 of p-AlGaAs with a low Al concentration. In this case an n-type dopant, such as sulfur, tellurium or selenium, would be used to provide the low resistivity channel 40 to achieve the same results.

A further variation shown in FIG. 4, uses a similar layered structure to that of FIG. 3 including an n-type GaAs substrate 10, followed by n-AlGaAs layer 12, p-AlGaAs layer 14 of low Al content, and p-AlGaAs layer 16. The last layer 18, however, which would normally be a p-type GaAs layer, is now changed to an n-type GaAs layer of low or residual doping and an intermediate resistivity. This opposite conductivity layer provides a reverse bias which acts as a barrier to prevent current conduction therethrough. A narrow p-type dopant layer 42 of low resistivity is then diffused into layer 18 adjacent the central area of contact 22 which is added later. This provides a low resistivity conductive area over the lower contact through layer 18. Current is thus confined to the path between contact layer 22, layer 42 and metal electrode 24 in the region around hole 26.

The present invention thus provides an improved current confinement structure and method for light emitting diodes. While several embodiments have been illustrated and described, it is apparent that other variations may be made in the particular configurations without departing from the scope of the invention as set forth in the appended claims.

What is claimed is:

1. A light emitting gallium arsenide-gallium aluminum arsenide diode comprising:
   a substrate layer of GaAs of a first conductivity type,
   a first layer of AlGaAs of said first conductivity type over said substrate layer,
   a second layer of AlGaAs on said first layer of AlGaAs, said second layer having a different Al concentration than said first layer,
   a third layer of AlGaAs of a second conductivity type on said second layer of AlGaAs,
   a fourth layer of GaAs on said third layer of AlGaAs,
   a first metal contact electrode in a central area on said fourth layer,
   a second metal contact electrode on the opposite side of said substrate layer,
   a light emitting well hole in a central area of said metal electrode on said substrate layer and in said substrate layer, and
   an area of proton bombardment induced high resistivity in said first, second, third and fourth layers surrounding said central area adjacent said first metal electrode on said fourth layer, said resistivity being sufficient to provide a current conduction barrier, said central area adjacent said first electrode being of a low resistivity within said surrounding high resistivity area.

2. A light emitting gallium arsenide-gallium aluminum arsenide diode comprising:
   a substrate layer of GaAs of a first conductivity type,
   a first layer of AlGaAs of said first conductivity type over said substrate layer,
   a second layer of AlGaAs on said first layer of AlGaAs, said second layer having a different Al concentration than said first layer,
   a third layer of AlGaAs of a second conductivity type on said second layer of AlGaAs,
   a fourth layer of GaAs on said third layer of AlGaAs,
   a first metal contact electrode in a central area on said fourth layer,
   a second metal contact electrode on the opposite side of said substrate layer,
   a light emitting well hole in a central area of said metal electrode on said substrate layer and in said substrate layer, and
   an undoped high resistivity layer of AlGaAs on said substrate layer between said substrate and first layer of AlGaAs, and a region of low resistivity including a diffused dopant in said substrate and in a portion of said undoped layer around said central well hole.

3. A light emitting gallium arsenide-gallium aluminum arsenide diode comprising:
   a substrate layer of GaAs of a first conductivity type,
   a first layer of AlGaAs of said first conductivity type over said substrate layer,
   a second layer of AlGaAs on said first layer of AlGaAs, said second layer having a different Al concentration than said first layer,
   a third layer of AlGaAs of a second conductivity type on said second layer of AlGaAs,
   a fourth layer of GaAs on said third layer of AlGaAs,
   a first metal contact electrode in a central area on said fourth layer,
   a second metal contact electrode on the opposite side of said substrate layer,
   a light emitting well hole in a central area of said metal electrode on said substrate layer and in said substrate layer, and
   whereby said fourth layer of GaAs comprises a first conductivity type opposite that of said third layer to provide a conduction barrier, and a region of low resistivity including a diffused dopant of said second conductivity type in said fourth layer in said central area adjacent said metal contact.

4. A method of making light emitting diodes of gallium arsenide-gallium aluminum arsenide including the steps of:
   forming a first layer of AlGaAs of a first conductivity type over a substrate layer of GaAs of said first conductivity type,
   forming a second layer of AlGaAs on said first layer of AlGaAs and of a different Al concentration than said first layer,
   forming a third layer of AlGaAs of a second conductivity type on said second layer,
   forming a fourth layer of GaAs on said third layer,
   forming a first metal contact electrode in a central area on said fourth layer,
   forming a second metal contact electrode on the opposite side of said substrate layer,
   forming a light emitting well hole in a central area of said metal electrode on said substrate layer and in said substrate layer, and
   forming current confining areas of altered resistivity in selected portions of said layers by proton bombardment of said selected portions of said layers around said central area of said fourth layer to provide a high resistivity in said layers to block current conduction in said selected portions.

5. A method of making light emitting diodes of gallium arsenide-gallium aluminum arsenide including the steps of:
   forming a first layer of AlGaAs of a first conductivity type over a substrate layer of GaAs of said first conductivity type,
   forming a second layer of AlGaAs on said first layer of AlGaAs and of a different Al concentration than said first layer, forming a third layer of AlGaAs of a second conductivity type on said second layer, forming a fourth layer of GaAs on said third layer, forming a first metal contact electrode in a central area on said fourth layer, forming a second metal contact electrode on the opposite side of said substrate layer, forming a light emitting well hole in a central area of said metal electrode on said substrate layer and in said substrate layer, and forming an undoped high resistivity layer of AlGaAs on said substrate layer between said substrate and first layer of AlGaAs, and diffusing a dopant into said substrate and in said undoped layer to form a region of low resistivity around said well hole.

6. A method of making light emitting diodes of gallium arsenide-gallium aluminum arsenide including the steps of:

forming a first layer of AlGaAs of a first conductivity type over a substrate layer of GaAs of said first conductivity type, forming a second layer of AlGaAs on said first layer of AlGaAs and of a different Al concentration than said first layer, forming a third layer of AlGaAs of a second conductivity type on said second layer, forming a fourth layer of GaAs on said third layer, forming a first metal contact electrode in a central area on said fourth layer, forming a second metal contact electrode on the opposite side of said substrate layer, forming a light emitting well hole in a central area of said metal electrode on said substrate layer and in said substrate layer, and forming said fourth layer of GaAs of a first conductivity type opposite that of said third layer to provide a reverse bias conduction barrier, and diffusing a dopant of said second conductivity type into said fourth layer in said central area adjacent said first metal contact to form a region of low resistivity.

7. An electro-optical device comprising:

a double heterostructure light emitting diode having a cavity extending within the diode to expose a portion of a light emitting region of the diode;

an optical fiber fixedly attached within the cavity to receive light from the exposed light emitting region; and selected areas of high resistivity within the diode to confine current conduction through the diode to the exposed light conducting region.

* * * * *